United States Patent
Turner

(10) Patent No.: US 7,154,291 B2
(45) Date of Patent: Dec. 26, 2006

(54) MEASURING BI-DIRECTIONAL CURRENT THROUGH A FIELD-EFFECT TRANSISTOR BY VIRTUE OF DRAIN-TO-SOURCE VOLTAGE MEASUREMENT

(75) Inventor: Steven Richard Turner, Carmel, IN (US)

(73) Assignee: Delphi Technologies, Inc., Troy, MI (US)

( * ) Notice: Subject to any disclaimer, the term of this patent is extended or adjusted under 35 U.S.C. 154(b) by 135 days.

(21) Appl. No.: 10/925,025

(22) Filed: Aug. 24, 2004

(65) Prior Publication Data

US 2006/0044003 A1  Mar. 2, 2006

(51) Int. Cl.
*G01R 31/26* (2006.01)
(52) U.S. Cl. ..................... 324/769; 324/765
(58) Field of Classification Search ............... None
See application file for complete search history.

(56) References Cited

U.S. PATENT DOCUMENTS

| 5,229,709 A | * | 7/1993 | Pfennings | 323/282 |
| 5,498,984 A | | 3/1996 | Schaffer | 327/51 |
| 5,576,648 A | * | 11/1996 | Rossi et al. | 327/110 |
| 6,642,738 B1 | * | 11/2003 | Elbanhawy | 324/769 |

FOREIGN PATENT DOCUMENTS

| EP | 0274995 A1 | * | 7/1988 |
| EP | 0315597 A | | 5/1989 |
| JP | 2004208185 A | | 7/2004 |
| WO | 9810301 A | | 3/1998 |

OTHER PUBLICATIONS

"741 Op-Amp Tutorial," University of Pennsylvania—School of Engineering & Applied Science, Mar. 20, 2002, http://www.seas.upenn.edu/courses/belab/ReferenceFiles/Electronics/LM741tutorial.pdf, pp. 1-9.*

* cited by examiner

*Primary Examiner*—Jermele Hollington
(74) *Attorney, Agent, or Firm*—Paul L. Marshall

(57) ABSTRACT

A method and apparatus for measuring current, and particularly bi-directional current, in a field-effect transistor (FET) using drain-to-source voltage measurements. The drain-to-source voltage of the FET is measured and amplified. This signal is then compensated for variations in the temperature of the FET, which affects the impedance of the FET when it is switched on. The output is a signal representative of the direction of the flow of current through the field-effect transistor and the level of the current through the field-effect transistor. Preferably, the measurement only occurs when the FET is switched on.

18 Claims, 3 Drawing Sheets

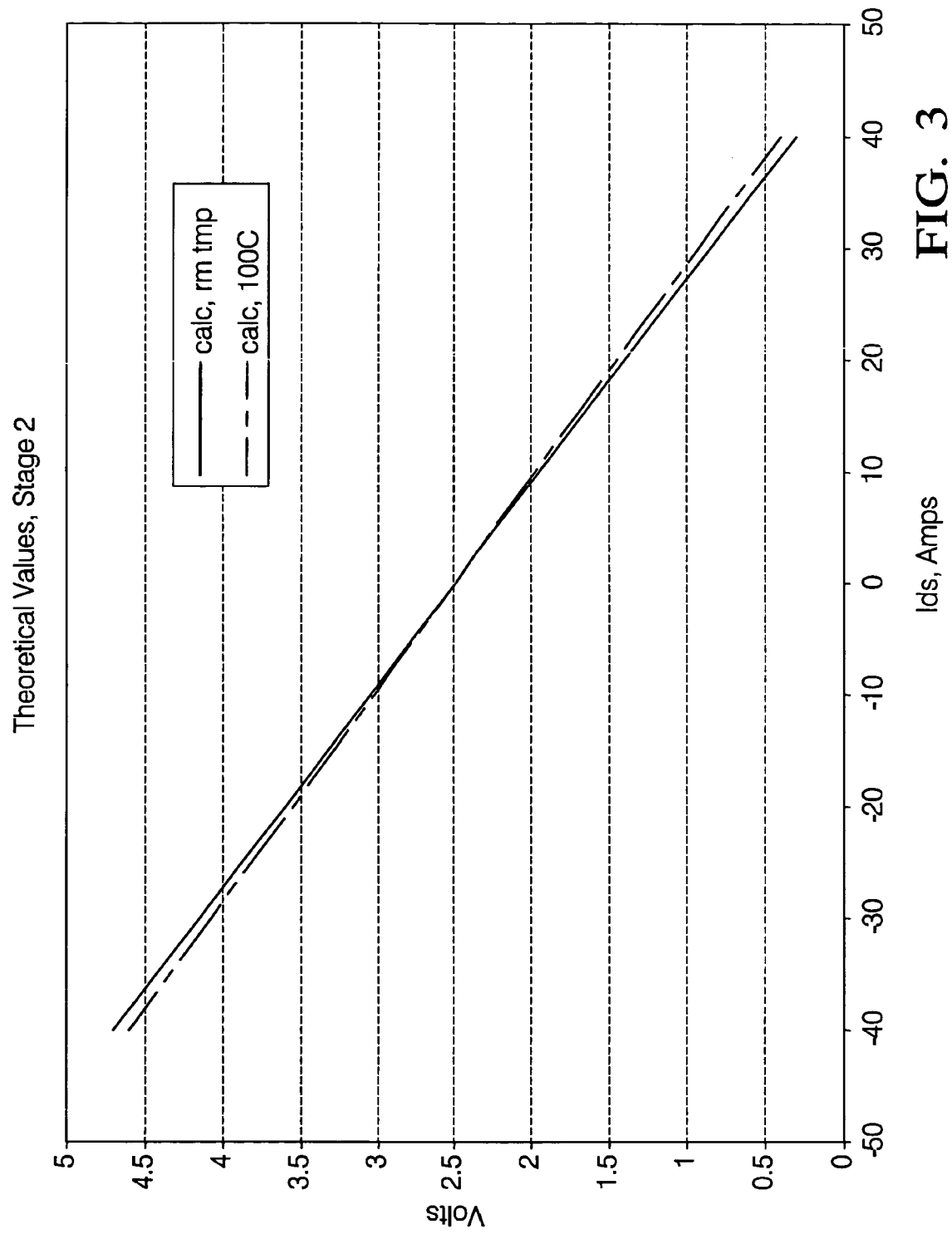

MEASURING BI-DIRECTIONAL CURRENT THROUGH A FIELD-EFFECT TRANSISTOR BY VIRTUE OF DRAIN-TO-SOURCE VOLTAGE MEASUREMENT

STATEMENT REGARDING FEDERALLY SPONSORED RESEARCH OR DEVELOPMENT

The U.S. Government has a paid-up license in this invention and the right in limited circumstances to require the patent owner to license others on reasonable terms as provided for by the terms of Contract No. DE-FC36-02G012020 awarded by the Department of Energy.

TECHNICAL FIELD

The invention relates to sensors and, more particularly, to a method and apparatus for measuring current in a field-effect transistor.

BACKGROUND OF THE INVENTION

In power electronics, it is sometimes necessary to measure the current through a field-effect transistor (FET). Typically this is accomplished by placing a sense resistor in electrical series with the FET and measuring the voltage drop across the resistor. For example, in new electric brake designs, the brake caliper is controlled by a screw and gear assembly connected to the motor shaft. The motor is controlled by an inverter employing a motor bridge circuit typically comprising switches in the form of FETs. For brake applications, it is necessary for the electronics to measure both motoring and regenerative current during operation of the motor. This is accomplished by measuring the voltage drop in a series shunt resistor due to these positive and negative motor currents. In this application, and in others measuring the current through a FET, such resistors are oftentimes costly and/or physically large.

It has been suggested to measure the drain-to-source voltage of the FET, which is present during the flow of current through the FET due to the presence of the on-resistance of the FET. However, the on-resistance of a FET varies significantly with temperature. In a typical FET, for example, the on-resistance at 175° C. is twice as high as it is at 25° C. This fact discourages the use of the drain-to-source voltage to sense current through a FET.

SUMMARY OF THE INVENTION

The invention proposes an alternative to the use of one or more sense resistors to measure current through a FET by measuring the drain-to-source voltage of the FET. The system and method according to the invention can measure both the positive and negative current flow (i.e., bi-directional current flow) through a FET and perform temperature compensation for the variation in the FET on-resistance due to temperature variations in the environment of the electronics.

The apparatus for measuring current in a field-effect transistor comprises means for measuring a drain-to-source voltage of the field-effect transistor; means for compensating the drain-to-source voltage for a temperature of the field-effect transistor; and means for generating an output representative of a direction of a flow of current through the field-effect transistor and a level of the current through the field-effect transistor. Similarly, the method for measuring current in a field-effect transistor comprises the steps of measuring a drain-to-source voltage of the field-effect transistor; compensating the drain-to-source voltage for a temperature of the field-effect transistor; and generating an output representative of a direction of a flow of current through the field-effect transistor and a level of the current through the field-effect transistor.

Unique features of the apparatus and method according to the invention are described in more detail hereinafter. Other applications of the present invention will become apparent to those skilled in the art when the following description of the best mode contemplated for practicing the invention is read in conjunction with the accompanying drawings.

BRIEF DESCRIPTION OF THE DRAWING

The description herein makes reference to the accompanying drawings wherein like reference numerals refer to like parts throughout the several views, and wherein:

FIG. 3 is a graph comparing the theoretical output of the second stage of the measurement circuit at two different temperatures.

DESCRIPTION OF THE PREFERRED EMBODIMENT

Figure 1:
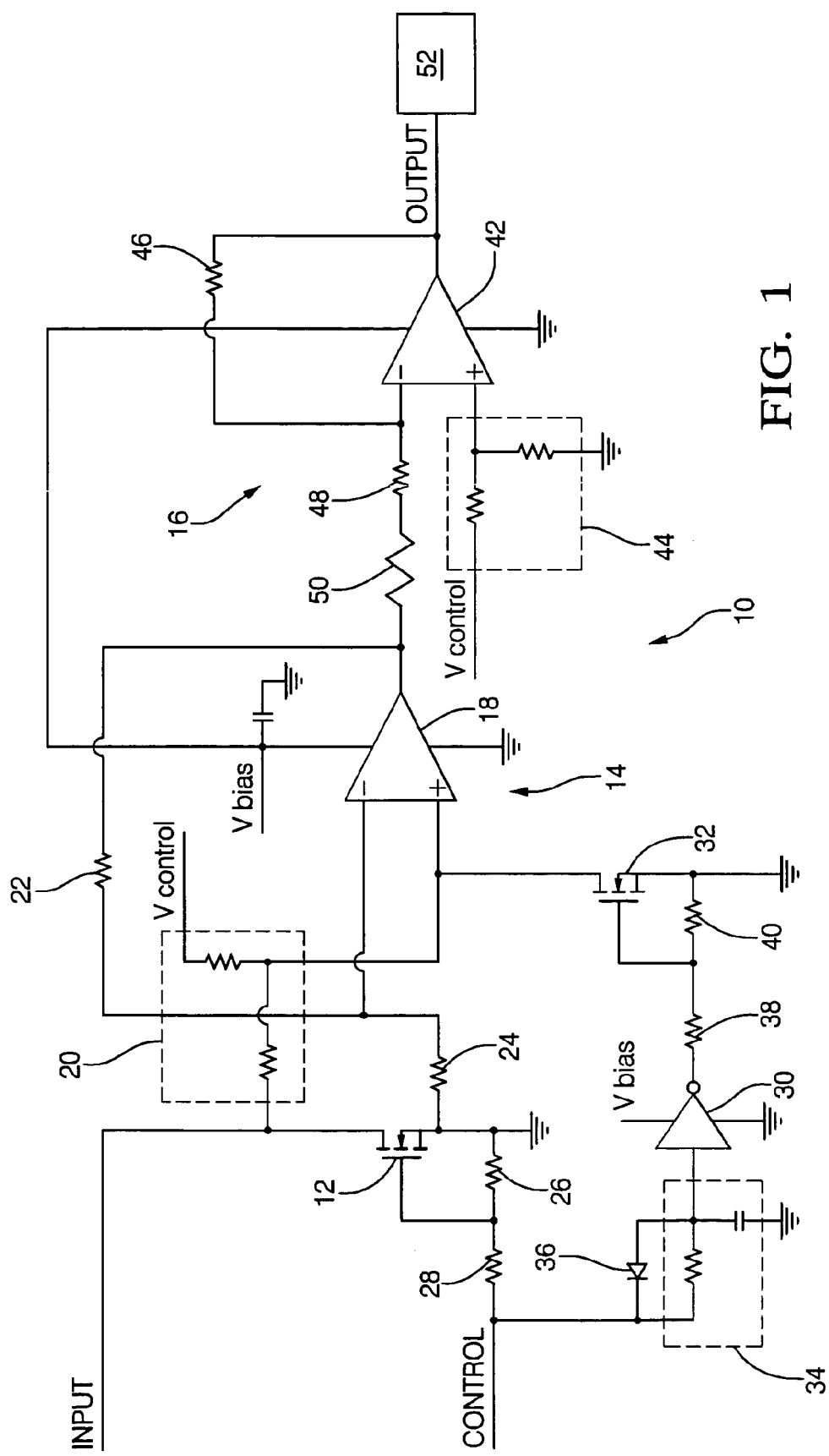
FIG. 1 is a schematic of a measurement circuit according to one embodiment of the present invention.

A method and apparatus for measuring bi-directional current according to the present invention is described with reference to FIGS. 1–3. A schematic of one measurement circuit 10 capable of measuring bi-directional current through a field-effect transistor (FET) 12 is shown in FIG. 1. The measurement circuit 10 includes generally a first stage 14 that measures the drain-to-source voltage (Vds) of the FET 12 and a second stage 16 that compensates the output of the first stage for the temperature of the FET 12.

Current through the FET 12 is supplied by a signal INPUT, which can be motor current. INPUT is not illustrated in detail because a variety of circuits and sources are possible and well known to those skilled in the art. For example, in automotive applications INPUT can be provided by a source such as a common 12-volt battery and a voltage regulator circuit coupled in series with a motor winding. The signal INPUT is connected to the drain of the FET 12. Switching of the FET 12, an n-channel FET as illustrated, is controlled by a drive signal labeled CONTROL, which is discussed in more detail herein.

The first stage 14 of the measurement circuit 10 includes an operational amplifier (op-amp) 18 configured as a differential amplifier. Preferably, the op-amp 18 (and the op-amp 42 discussed hereinafter) are high-speed op-amps such as part no. LM6132. The drain of the FET 12 is coupled to the non-inverting input of the op-amp 18 through a resistor divider 20 that biases the op-amp 18 such that at zero current through the FET 12 the output of the first stage 14, which is the output of the op-amp 18, is equal to a biasing voltage, which is generally a mid-point of the control voltage (Vcontrol) of the measurement circuit 10. For example, where the power circuit bias voltage (Vbias) is 12 volts, a reasonable control voltage could be supplied by a 5-volt precision reference. In this case, the resistor divider 20 would bias the op-amp 18 such that at zero current through the FET 12 the output of the first stage 14 would be equal to 2.5 volts.

Negative feedback through a resistor 22 from the output of the op-amp 18 is coupled the source of the FET 12 through a resistor 24. A pull-down resistor 26 interconnects the gate of FET 12 with ground. In this differential amplifier configuration, current flow in the ground path is excluded from the measurement.

In this description, positive current flow is the direction of current flow through the FET 12 during motoring, and negative current flow is the direction of current flow through the FET 12 during regenerating. The op-amp 18 of the first stage 14 has a gain A1 such that at the maximum positive current through the FET 12, the first stage output approaches Vcontrol at an expected maximum temperature. Similarly, the gain A1 of the op-amp 18 of the first stage 14 is such that at the maximum negative current through the FET 12, the first stage output approaches zero volts at the expected maximum temperature. The voltage output of the first stage 14 is given by the following equation:

$$V_{out\_stage1} = (A1 \times I \times Rds\_on) + \text{Biasing\_voltage volts}; \quad (1)$$

where
A1 is the gain of the op-amp 18;
I is the current through the FET 12;
Rds_on is the on-resistance of the FET 12; and
Biasing_voltage is the desired output of the op-amp 18 when the current through the FET 12 is zero.

In one typical FET, Rds_on at 175° C. is 0.0056 ohms. Where the current flow through the FET 12 varies from a positive current of 40 amps to a negative current of 40 amps, and Biasing_voltage is equal to 2.5 volts, a gain of 10.5 results in a desirable range of voltage outputs. At the maximum positive current and maximum temperature, the stage 1 output is equal to (10.5×40 amps×0.0056 ohms)+2.5 volts=4.852 volts. Likewise, at the maximum negative current and maximum temperature, the stage 1 output is equal to (10.5×−40 amps×0.0056 ohms)+2.5 volts=0.148 volts.

The drive signal CONTROL is coupled to the gate of the FET 12 through a voltage divider formed by resistors 26 and 28. The drive signal CONTROL also provides an input for an inverter 30 and a second FET 32. Specifically, the drive signal CONTROL is coupled to the inverter 30 through an RC network 34. A diode 36 is coupled across the resistor of the RC network 34 such that the cathode of the diode 36 is coupled to the drive signal CONTROL and the anode is coupled to the junction of the RC network 34. The output of the inverter 30 is coupled to the gate of the FET 32 through a voltage divider comprising resistors 38 and 40. The drain of the FET 32 is coupled to the non-inverting input of the op-amp 18, and the source of the FET 32 is grounded.

The purpose of the inverter 30 and the FET 32 is to drive the input to the first stage 14 to zero volts whenever the FET 12 is switched off because Vds is only of interest during the on-time of the FET 12. Essentially, the current from INPUT that is to be measured only flows through FET 12 when the FET 12 is switched on. The FET 32 is controlled by the inverter 30 so that the first stage input, i.e., the non-inverting input of the op-amp 18, is pulled to ground during the off-time of the FET 12. Pulling this input to ground (zero volts) eliminates large excursions in voltage from being introduced at the first stage input that would otherwise produce an incorrect reading of current through the FET 12.

The RC network 34 at the input to the inverter 30 ensures that the FET 12 is fully enhanced, i.e., it is fully turned on, before Vds of the FET 12 is allowed to pass to the first stage 14. The RC time constant of the RC network 34 should be determined based upon the period of the pulse-width modulated (PWM) frequency of the drive signal CONTROL such that it delays an input to the first stage 14, while still allowing the on-time Vds to be well-established at the non-inverting input of the op-amp 18. In the examples previously discussed and where the PWM frequency is 13 KHz, a RC time constant of 0.08 μsec, which is 0.1% of the period of the PWM frequency, successfully delays the input to the first stage 14 and allows the legitimate on-time Vds to be well-established at the non-inverting input of the op-amp 18.

The output voltage of the first stage 14 is representative of the current through the FET 12, but it is uncorrected for temperature. As mentioned herein above, the second stage 16 of the measurement circuit 10 corrects the effects of temperature on the value of Rds_on. The temperature-correcting circuitry of the second stage 16 includes the op-amp 42 which is configured as an inverting amplifier. Specifically, Vcontrol is connected to the non-inverting input of the op-amp 42 through a voltage divider 44 such that the voltage applied to the non-inverting input is equal to Biasing_voltage. The output of the first stage 18 is coupled to the op-amp 42 through a feedback circuit. The feedback circuit includes a feedback loop with a resistor 46 coupled to a resistor 48 at the inverting input of the op-amp 42.

The feedback circuit of the second stage 16 also includes a thermistor, preferably a positive-temperature-coefficient (PTC) thermistor 50, in series with the output of the first stage 14 and the resistor 48. The PTC thermistor 50 should be located at or near the FET 12. In one particularly preferred embodiment, the PTC thermistor 50 is glued directly to the FET 12. The resistance of the PTC thermistor 50 is selected such that it is nearly linear with respect to temperature in the region of interest. The output of the second stage 16 is thus a temperature-compensated inverse of the output of the first stage 14.

The op-amp 42 of the second stage 16 has a gain A2 set in a similar manner as the gain A1 in the op-amp 18 of the first stage 14. Namely, at the maximum positive current through the FET 12, the second stage output approaches zero volts at an expected maximum temperature. Similarly, the gain A2 of the op-amp 42 is such that at the maximum negative current through the FET 12, the second stage output approaches Vcontrol at the expected maximum temperature. Thus, advantage is taken of the full output voltage range. The voltage output of the second stage 16 is given by the following equation:

$$V_{out\_stage2} = \text{Biasing\_voltage} - \left[\frac{(R46 \times V_{out\_stage1}) - 7900}{R48 + R_{thermistor}}\right] \text{volts}; \quad (2)$$

Biasing_voltage is the desired output of the op-amp 42 when the current through the
FET 12 is zero;
R46 is the resistance of resistor 46;
R48 is the resistance of resistor 48;
Rthermistor is the resistance of the PTC resistor 50; and
Vout_stage1 is the output voltage of the first stage 14.

So, the measurement circuit 10 provides a temperature-compensated output between zero and a maximum voltage that correlates roughly linearly with current through a FET, such as FET 12, where the current can vary over a range including positive and negative values, i.e., the FET experiences bi-directional current flow. The output of the second stage 16 can be read by an analog-to-digital (A/D) input of a microprocessor 52 or the like for use in, for example, a motor-control algorithm.

The measurement circuit 10 described was tested using a pulse generator set at 10 Hz, with a pulse-width of 200 μsec. The output voltage at the first stage 14, the output voltage at the second stage 16, and the FET current was measured from zero to 40 amps and from zero to −40 amps in five-amp increments. Testing was performed and data was collected at both 25° C. and 100° C. To illustrate the accuracy of the foregoing measurement circuit 10, an analysis for a positive current of 30 amps at room temperature is described below. The FET used for the test had an Rds_on of 0.0025 Ohms at 25° C.

The output voltage of the first stage 14 is a function of Rds_on of the FET 12, which in the testing had a range of resistance values of 0.0023 Ohms to 0.0033 Ohms at room temperature. Where the gain A1 of the op-amp 18 is equal to 10.5 and Biasing_voltage is equal to 2.5 volts as in the examples above, the lower and upper limits for the voltage output of the first stage 14 are calculated using equation (1) as follows:

Lower limit=(10.5×30 amps×0.0023 Ohms)+2.5 volts=3.225 volts; and

Upper limit=(10.5×30 amps×0.0033 Ohms)+2.5 volts=3.540 volts.

The measured voltage at the output of the first stage 14 is 3.37 volts, which is within the calculated range.

For the calculation of the output voltage of the second stage 16, values of R46=3160 Ohms and R48=510 Ohms were used in the measurement circuit 10. The output voltage of the second stage 16 is calculated using equation (2) as follows:

$$\text{Vout\_stage2}(calc.) = 2.5 - \left[\frac{3160 \times \text{Vout\_stage1} - 7900}{510 + \text{Rthermistor}}\right] \text{volts}.$$

Vout_stage1 is calculated using an Rds_on of 0.0025 Ohms as described previously in formula (1) above and is equal to 3.288 volts. Where Rthermistor is 1000 Ohms, the output voltage of the second stage 16 is equal to:

$$2.5 - \frac{3160 \times 3.288 - 7900}{510 + 1000} = 0.851 \text{ volts}.$$

The measured voltage at the output of the second stage 16 is 0.89 volts.

A similar analysis for all of the tested data points revealed that the measured data are all within the range of the theoretical (calculated) results. The following table summarizes the measured test results at various current levels (I) as well as the calculated values for the voltage output of the first stage 14 (V__1st) and the voltage output of the second stage 16 (V__2nd) at 25° C. and 100° C.

|   | Measured, 25° C. | | Measured, 100° C. | | Calculated V__1st | | Calculated V__2nd | |
|---|---|---|---|---|---|---|---|---|
| I | V__1st | V__2nd | V__1st | V__2nd | 25° C. | 100° C. | 25° C. | 100° C. |
| 40 | 3.650 | 0.40 | 4.00 | 0.30 | 3.550 | 3.970 | 0.30 | 0.39 |
| 35 | 3.520 | 0.61 | 3.86 | 0.60 | 3.419 | 3.786 | 0.57 | 0.66 |
| 30 | 3.370 | 0.89 | 3.65 | 0.87 | 3.288 | 3.603 | 0.85 | 0.92 |
| 25 | 3.230 | 1.14 | 3.48 | 1.14 | 3.156 | 3.419 | 1.12 | 1.18 |
| 20 | 3.100 | 1.40 | 3.28 | 1.42 | 3.025 | 3.235 | 1.40 | 1.44 |
| 15 | 2.950 | 1.68 | 3.10 | 1.70 | 2.894 | 3.051 | 1.67 | 1.71 |
| 10 | 2.800 | 1.92 | 2.90 | 1.95 | 2.763 | 2.868 | 1.95 | 1.97 |
| 5 | 2.700 | 2.20 | 2.71 | 2.20 | 2.631 | 2.684 | 2.22 | 2.23 |
| 0 | 2.540 | 2.47 | 2.54 | 2.47 | 2.500 | 2.500 | 2.50 | 2.50 |
| (5) | 2.410 | 2.75 | 2.33 | 2.75 | 2.369 | 2.316 | 2.77 | 2.76 |
| (10) | 2.280 | 3.02 | 2.15 | 3.00 | 2.238 | 2.133 | 3.04 | 3.02 |
| (15) | 2.160 | 3.29 | 1.95 | 3.28 | 2.106 | 1.949 | 3.32 | 3.28 |
| (20) | 2.020 | 3.55 | 1.77 | 3.53 | 1.975 | 1.765 | 3.59 | 3.55 |
| (25) | 1.900 | 3.80 | 1.59 | 3.80 | 1.844 | 1.581 | 3.87 | 3.81 |
| (30) | 1.700 | 4.02 | 1.35 | 4.00 | 1.713 | 1.398 | 4.14 | 4.07 |
| (35) | 1.600 | 4.30 | 1.20 | 4.25 | 1.581 | 1.214 | 4.42 | 4.33 |
| (40) | 1.400 | 4.55 | 1.00 | 4.55 | 1.450 | 1.030 | 4.69 | 4.60 |

Figure 2:
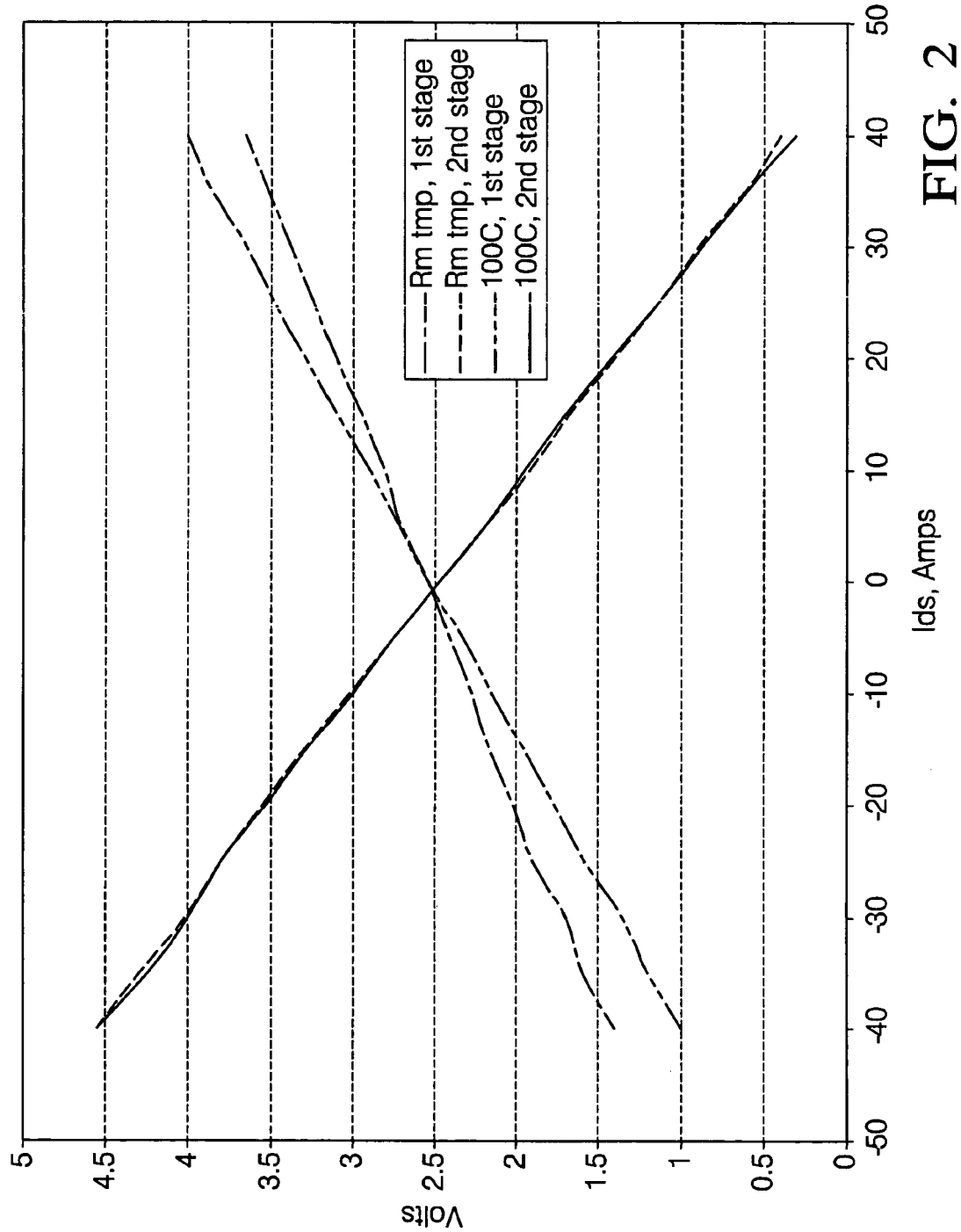
FIG. 2 is a graph showing the output of the first stage and the second stage of the measurement circuit according to FIG. 1 versus the FET drain current taken at two different temperatures.

FIG. 2 is a graph depicting the measured values for the output of each of the first stage 14 and the second stage 16 (labeled Stage 1 and Stage 2, respectively) for temperatures of 25° C., which is room temperature, and 100° C. As expected, the slope of the output for the first stage 14 is greater at 100° C. than at 25° C. As desired, the second stage 16 corrects this through the use of the PTC thermistor 50 in the feedback circuit of the op-amp 42. The output of the second stage 16 at 25° C. is nearly identical to that for 100° C., and the graphs show good linearity of the output with respect to the current through the FET 12.

Review of the table of theoretical values indicates a greater slope for the output of the second stage 16 at 25° C. than the slope of the output at 100° C. This is due to the non-linearity of the PTC thermistor 50. The effect is quite small and is small enough that is not apparent in the graph of the measured data, which is shown in FIG. 2. Comparing the measured data graph (FIG. 2) to the theoretical values graph (FIG. 3) indicates good correlation, which verifies good performance of the measurement circuit 10.

Analysis was also performed using test circuits to determine any sources of error in the measurement circuit 10. This analysis showed that the largest single source of error in the measurement is the variation that can exist in the resistance from the drain-to-source when the FET 12 is on (Rds_on), which depends upon the given FET 12. The data sheet for the FET used in testing had a possible range for this resistance value of +/−13%. The worst-case individual accuracies from 0° to 125° C. for various sections of the measurement circuit 10 are indicated below:

Rds_on of FET 12: +/−13%
Differential amp 18: +/−2.5%
Thermistor 50: +/−4%
Vbias supply: +/−5%
Op-amp 42: +/−2.5%

The root-sum-squared result of these values provides a composite accuracy of the measurement circuit 10 of +/−15%.

To maximize current measurement accuracy for products employing the circuitry of the invention, calibration of each finished product could be performed. Such calibration could be done during product testing and could compensate for the inherent variations in Rds_on from part to part. If the Rds_on variation is controlled, either through FET sorting or by product calibration, the accuracy of the method and apparatus according to the present invention can be greatly improved.

The measurement circuit 10 works well as a replacement for current sense resistors and associated circuitry. The cost is not excessive, and the reliability is high. The speed of the components combined with the bi-directional current capability make this technique viable for four-quadrant motor control, DC to DC converter control, solenoid and fuel injector drivers, and general over-current protection.

While the invention has been described in connection with what is presently considered to be the most practical and preferred embodiment, it is to be understood that the invention is not to be limited to the disclosed embodiments but, on the contrary, is intended to cover various modifications and equivalent arrangements included within the spirit and scope of the appended claims, which scope is to be accorded the broadest interpretation so as to encompass all such modifications and equivalent structures as is permitted under the law.

The invention claimed is:

1. An apparatus for measuring current in a field-effect transistor, comprising:
   means for measuring a drain-to-source voltage of the field-effect transistor (12);
   means for compensating the drain-to-source voltage for a temperature of the field-effect transistor;
   means for generating an output representative of a direction of a flow of current through the field-effect transistor and a level of the current through the field-effect transistor,
   wherein the measuring means further comprises a differential amplifier coupled to the field-effect transistor and receiving a signal indicative of the drain-to-source voltage of the field-effect transistor; and
   biasing means coupled to the differential amplifier for biasing an output voltage of the differential amplifier,
   wherein the generating means further comprises an inverting amplifier receiving the output voltage of the differential amplifier.

2. The apparatus according to claim 1 wherein the differential amplifier comprises a high-speed operational amplifier.

3. The apparatus according to claim 1 wherein the compensating means further comprises a thermistor in a feedback circuit of the inverting amplifier.

4. The apparatus according to claim 3 wherein the thermistor is a positive-temperature-coefficient thermistor.

5. The apparatus according to claim 3, further comprising:
   means for driving an input of the differential amplifier to zero volts when the field-effect transistor is switched off.

6. The apparatus according to claim 5, further comprising:
   delaying means coupled to the driving means for delaying a non-zero value from reaching the input of the differential amplifier when the field-effect transistor is switched on.

7. The apparatus according to claim 1 further comprising:
   biasing means coupled to the inverting amplifier for biasing an output voltage of the inverting amplifier.

8. The apparatus according to claim 7 wherein a biasing voltage of the differential amplifier is equal to a biasing voltage of the inverting amplifier.

9. An apparatus for measuring current in a field-effect transistor, comprising:
   means for measuring a drain-to-source voltage of the field-effect transistor;
   means for compensating the drain-to-source voltage for a temperature of the field-effect transistor; and
   means for generating an output representative of a direction of a flow of current through the field-effect transistor and a level of the current through the field-effect transistor,
   wherein the generating means further comprises an inverting amplifier receiving the output voltage of the differential amplifier.

10. The apparatus according to claim 9 wherein the compensating means further comprises a thermistor in a feedback circuit of the inverting amplifier.

11. An apparatus for measuring current in a field-effect transistor, comprising:
    means for measuring a drain-to-source voltage of the field-effect transistor;
    means for compensating the drain-to-source voltage for a temperature of the field-effect transistor;
    means for generating an output representative of a direction of a flow of a current through the field-effect transistor and a level of the current through the field-effect transistor; and
    means coupled to the measuring means for preventing the measuring step when the field-effect transistor is switched off.

12. The apparatus according to claim 11 further comprising:
    means coupled to the preventing means for delaying a measurement of the drain-to-source voltage when the field-effect transistor is switched on.

13. An apparatus for measuring current in a field-effect transistor, comprising:
    means for measuring a drain-to-source voltage of the field-effect transistor;
    means for compensating the drain-to-source voltage for a temperature of the field-effect transistor; and
    means for generating an output representative of a direction of the flow of current through the field-effect transistor and a level of current through the field-effect transistor,
    wherein the compensating means further comprises a thermistor located one of at and near the field-effect transistor.

14. The apparatus according to claim 13 wherein the thermistor is a positive-temperature-coefficient thermistor having a nearly linear resistance value with respect to temperature in a temperature range of interest.

15. A method for measuring current in a field-effect transistor,
comprising the steps of:
measuring a drain-to-source voltage of the field-effect transistor;
compensating the drain-to-source voltage for a temperature of the field-effect transistor;
generating an output representative of a direction of a flow of current through the field-effect transistor and a level of the current through the field-effect; and
preventing the measuring step when the field-effect transistor is switched off.

16. The method according to claim 15, further comprising the step of:
delaying the measuring step when the field-effect transistor is switched on.

17. A method for measuring current in a field-effect transistor, comprising the steps of:
measuring a drain-to-source voltage of the field-effect transistor;
compensating the drain-to-source voltage for a temperature of the field-effect transistor; and
generating an output representative of a direction of a flow of current through the field-effect transistor and a level of the current through the field-effect transistor,
wherein the compensating step further comprises the step of locating a thermistor one of at and near the field-effect transistor.

18. The method according to claim 17 wherein the thermistor is a positive temperature-coefficient thermistor having a nearly linear resistance value with respect to temperature in a temperature range of interest.

* * * * *